US012738319B2

(12) United States Patent
You et al.

(10) Patent No.: US 12,738,319 B2
(45) Date of Patent: Sep. 15, 2026

(54) MEMORY DEVICES, METHODS FOR OPERATING MEMORY DEVICES AND MEMORY SYSTEMS

(71) Applicant: Yangtze Memory Technologies Co., Ltd., Hubei (CN)

(72) Inventors: Kaikai You, Hubei (CN); Lei Jin, Hubei (CN); XiangNan Zhao, Hubei (CN); Lei Guan, Hubei (CN); Ying Huang, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 31 days.

(21) Appl. No.: 18/916,201

(22) Filed: Oct. 15, 2024

(65) Prior Publication Data

US 2025/0378881 A1 Dec. 11, 2025

(30) Foreign Application Priority Data

Jun. 11, 2024 (CN) ........................ 202410749386.X

(51) Int. Cl.
*G11C 16/10* (2006.01)
*G11C 16/04* (2006.01)
*G11C 16/08* (2006.01)

(52) U.S. Cl.
CPC .......... *G11C 16/10* (2013.01); *G11C 16/0483* (2013.01); *G11C 16/08* (2013.01)

(58) Field of Classification Search
CPC ..... G11C 16/10; G11C 16/0483; G11C 16/08; G11C 11/5628; G11C 16/3427
USPC ........................................ 365/185.11, 185.24
See application file for complete search history.

(56) References Cited

U.S. PATENT DOCUMENTS

| | | | | |
|---|---|---|---|---|
| 10,607,938 | B1 * | 3/2020 | Rubin | H10D 88/00 |
| 11,024,393 | B1 * | 6/2021 | Zhang | G11C 16/0483 |
| 11,037,635 | B1 * | 6/2021 | Lien | G11C 16/10 |
| 11,183,245 | B1 * | 11/2021 | Chen | G11C 16/08 |
| 2007/0047313 | A1 * | 3/2007 | Hosono | G11C 16/0483 365/185.17 |
| 2013/0250689 | A1 * | 9/2013 | Lai | G11C 16/10 365/185.17 |
| 2017/0194057 | A1 * | 7/2017 | Lee | G11C 16/10 |
| 2022/0172780 | A1 * | 6/2022 | Choi | G11C 16/26 |
| 2022/0216328 | A1 * | 7/2022 | Suh | H10D 30/024 |
| 2024/0177781 | A1 * | 5/2024 | Lien | G11C 11/5642 |
| 2024/0371444 | A1 * | 11/2024 | Zhao | G11C 16/3459 |

* cited by examiner

*Primary Examiner* — Michael T Tran
(74) *Attorney, Agent, or Firm* — Hanley, Flight & Zimmerman, LLC

(57) ABSTRACT

The present application provides a memory device, a method for operating a memory device, and a memory system. The memory device includes a memory array and a peripheral circuit coupled to the memory array, the memory array includes a memory block, and the memory block is coupled to the peripheral circuit through a word line. The memory block includes programmed memory cells and an unprogrammed memory cell, and the programmed memory cells include a first and a second memory cell. The peripheral circuit is configured to: perform a program operation on a third memory cell in the memory block, apply a first voltage to a first word line coupled to the first memory cell in a first phase of a channel preparation phase of the program operation; and apply a second voltage to a second word line coupled to the second memory cell.

20 Claims, 18 Drawing Sheets

MEMORY DEVICES, METHODS FOR OPERATING MEMORY DEVICES AND MEMORY SYSTEMS

CROSS-REFERENCE TO RELATED APPLICATION

This application claims priority to and the benefit of Chinese Patent Application 202410749386.X, filed on Jun. 11, 2024, which is hereby incorporated by reference in its entirety.

FIELD OF TECHNOLOGY

The present application belongs to the field of semiconductor chip technology, and in particular relates to memory devices, methods for operating memory devices and memory systems.

BACKGROUND

Flash memory is a type of memory device having features, such as data non-volatility, fast read and write speeds, low power consumption, and long service life, which is widely used in a variety of electronic products, such as mobile phone, computer, smart sensor and positioning device, etc.

BRIEF DESCRIPTION OF THE DRAWINGS

In order to illustrate the technical solutions in the present application more clearly, the following will briefly introduce the accompanying drawings used in some examples of the present application, apparently, the accompanying drawings in the following description are only drawings of some examples of the present application, and those skilled in the art can also obtain other drawings according to these accompanying drawings. In addition, the accompanying drawings in the following description may be regarded as schematic diagrams, and are not limitations on the actual size of the product involved in the examples of the present application, actual flows of methods, actual timings of signals, etc.

Figure 1:
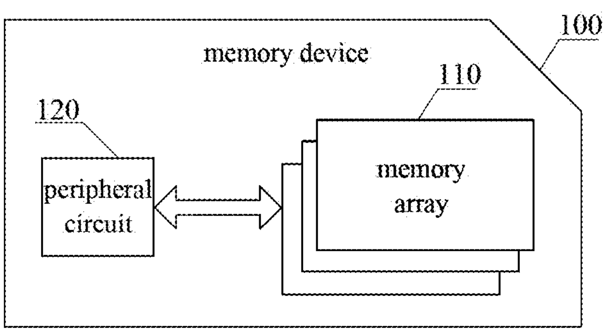
FIG. 1 is a structure schematic diagram of a memory device provided by an example of the present application.

Reference numerals: 100. memory device; 110. memory array; 120. peripheral circuit; 121. control logic unit; 122. I/O interface; 123. voltage generator; 124. column decoder; 125. row decoder; 126. page buffer; 127. data bus; 128. register; 200. memory block; 210. memory string; 211. top selected transistor; 212. memory cell; 213. dummy memory cell; 214. bottom selected transistor; 310. substrate; 320. memory deck layer; 321. gate conductive layer; 322. dielectric layer; 410. bit line; 420. source line; 430. string selected line; 440. word line; 450. dummy word line; 460. ground selected line; 600. memory system; 500. memory controller.

DETAILED DESCRIPTION

The technical solutions in some examples of the present application will be clearly and completely described below in conjunction with the accompanying drawings FIG. 1-FIG. 18, apparently, the described examples are only some, not all of examples of the present application. All other examples obtained by those skilled in the art based on the examples provided in the present application belong to the claimed scope of the present application.

Unless the context requires otherwise, throughout the description and claims, the term “comprising” is interpreted as open and inclusive, i.e., “including, but not limited to”. In the description of the present disclosure, the terms “one example”, “some examples”, “exemplary example”, “exemplarily” or “some examples” are intended to indicate that a particular feature, structure, material, or characteristic related to the example or example is included in at least one example or example of the present application. Illustrative representations of the terms described above are not necessarily referring to a same example or example. Furthermore, particular feature, structure, material or characteristic described above may be included in any suitable manner in any one or more examples or examples.

Hereinafter, the terms “first” and “second” are used for descriptive purposes only, and should not be understood as indicating or implying relative importance or implicitly specifying the quantity of indicated technical features. Thus, a feature defined as "first" and "second" may explicitly or implicitly include one or more of these features. In the description of examples of the present application, "multiple" means two or more, unless specified otherwise.

In describing some examples, the expressions "coupling" and their derivatives may be used. For example, in describing some examples, the term "coupling" may be used to indicate that two or more elements are in direct physical or electrical contact, in this case, "coupling" may also be described as "connecting". Additionally, the term "coupling" may also mean that two or more elements are not in direct contact with each other, but yet still co-operate or interact with each other. Examples disclosed herein are not necessarily limited by the context herein.

The use of "configured to" herein means open and inclusive language that does not exclude devices that are suitable for or configured to perform additional tasks or operations.

As consumers' requirements for the performance of electronic products increase, higher demands on the read speed, write (also known as program) speed, service life, and reliability of flash memory (memory device) are desired in the market.

FIG. 1 shows a structure schematic diagram of a memory device provided by an example of the present application. As shown in FIG. 1, the memory device 100 may include a memory array 110 and a peripheral circuit 120, and the peripheral circuit 120 is coupled to the memory array 110. In some examples, the peripheral circuit 120 and the memory array 110 may be independently manufactured on two wafers employing different semiconductor manufacturing processes. The peripheral circuit 120 is bonded to the memory array 110 by bonding the two wafers. In some examples, the memory array 110 may employ a mature manufacturing process (e.g., any manufacturing process of 22 nm, 28 nm and above, etc.) to ensure the stability of stored data. The peripheral circuit 120 may be manufactured using an advanced manufacturing process (e.g., any manufacturing process of 14 nm, 10 nm and below, etc.), thereby helping to improve the speed of reading/storing data of the memory device 100.

Figure 2:
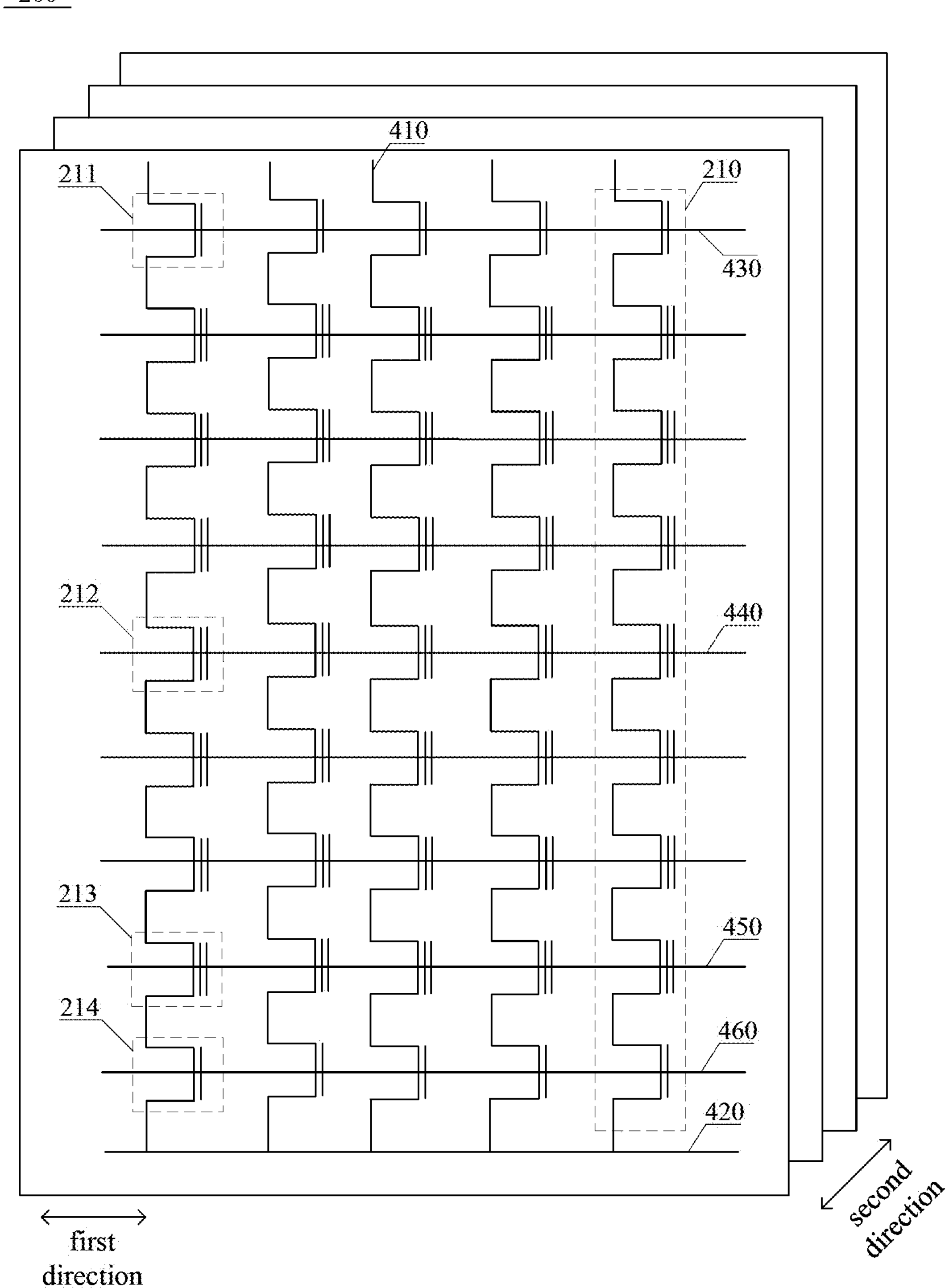
FIG. 2 is a structure schematic diagram of a memory array provided by an example of the present application.

In some examples, the memory array 110 may include multiple memory blocks. As shown in FIG. 2, the memory block 200 may include multiple memory strings 210; wherein each memory string 210 may include a top selected transistor (TSG) 211, multiple memory cells 212, a dummy memory cell 213, and a bottom selected transistor (BSG) 214, which are sequentially stacked in series. In the example of the present application, the memory cell 212 may be a device capable of storing charge, such as a floating gate transistor or a charge trap field effect transistor.

Figure 3:
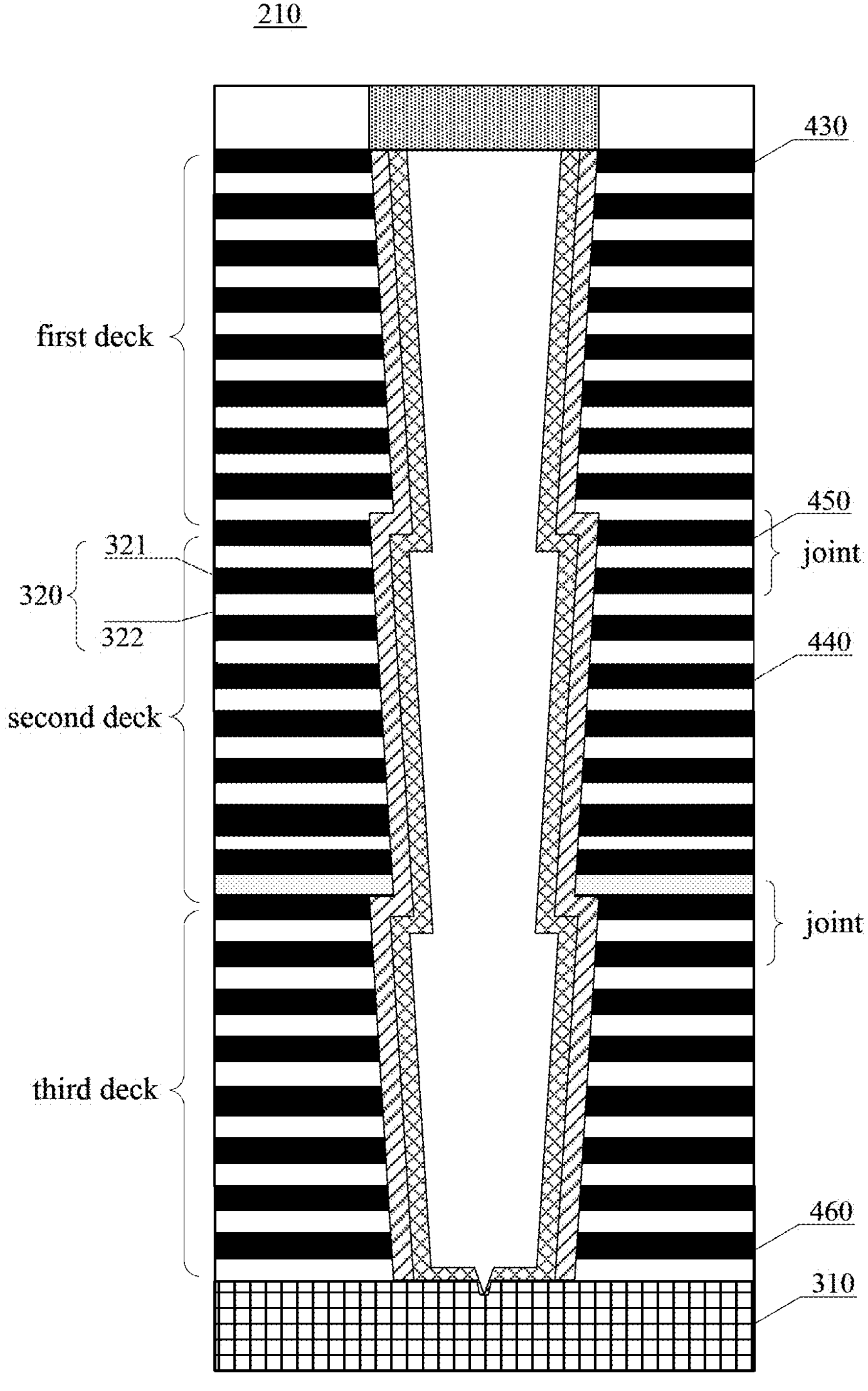
FIG. 3 is a partial cross-sectional schematic diagram of a memory string provided by an example of the present application.

FIG. 3 shows a partial cross-sectional schematic diagram of a possible memory string of the present application. The memory string 210 may extend vertically above the substrate 310 and through the memory deck layers 320. Due to the limitation of the etching process, in some examples, multiple decks may be formed by etching multiple times, and two adjacent decks may be closely connected by forming a heavily doped joint to increase the number of stacking layers of the memory deck layer 320. Among them, heavy doping refers to the situation where the amount of impurities doped into the semiconductor material is large, and the heavily doped joint is used to ensure that a close connection relationship may be formed between the two decks. In some examples, the channel between two adjacent decks may be connected (as shown in FIG. 3). In other examples, the channel between two adjacent decks may also be disconnected (not shown in the drawings).

In some implementations, the substrate 310 may include silicon (e.g., monocrystalline silicon), silicon germanium (SiGe), gallium arsenide (GaAs), germanium (Ge), silicon-on-insulator (SOI), germanium-on-insulator (GOI), or any other appropriate material. The memory deck layer 320 may include alternating gate conductive layers 321 and dielectric layers 322. The number of gate conductive layers 321 and dielectric layers 322 in the memory deck layer 320 may determine the number of memory cells 212 in memory string 210. The gate conductive layer 321 may include conductive materials including but not limited to tungsten (W), cobalt (Co), copper (Cu), aluminum (Al), polysilicon, doped silicon, silicide or any combination thereof.

Each gate conductive layer 321 may include a control gate surrounding the memory cell 212, and the gate conductive layer 321 at the top of the memory deck layer 320 may extend laterally as a string selected line (SSL) 430, the gate conductive layer 321 at the bottom of the memory deck layer 320 may extend laterally as a ground selected line (GSL) 460, or the gate conductive layer 321 between the string selected line 430 and the ground selected line 460 may extend laterally as a word line (WL) 440 or a dummy WL 450.

Similar to word line 440, dummy word line 450 may have the same conductive layer structure as word line 440, and in some examples, dummy word line 450 may be formed simultaneously with word line 440 employing the same process. Unlike word line 440, dummy memory cell 213 coupled to dummy word line 450 does not store data. In some examples, dummy memory cell 213 coupled to dummy word line 450 may not have any connection with bit line (BL) 410, thus it cannot transmit data to bit line 410. Dummy word line 450 may reduce noise interference to word line 440. In some examples, by setting dummy memory cell 213, capacitive coupling noise between selected transistor (e.g., top selected transistor 211, bottom selected transistor 214) and memory cell 212 may be reduced by 50%, thereby reducing program interference, read failure and erase failure caused by coupling noise.

In some examples, dummy word line 450 is set near the heavily doped joint. In some examples, the dummy word line 450 may also be disposed between the string selected line 430 and the word line 440, between the word line 440 and the ground selected line 460, or between the word line 440 and the word line 440. The location and number of the dummy word line 450 may be adaptively changed, which is not limited in the present application.

It is to be understood that although not shown in FIG. 3, additional components of the memory array 110 may be formed, the additional components including but not limited to gate line gaps/source contacts, local contacts, interconnection layers, etc.

As shown in FIG. 2, memory strings 210 may be arranged in a row along a first direction, and multiple rows of memory strings 210 may be arranged in a second direction perpendicular to the first direction as a memory block 200. In some examples, in the memory strings 210 of the same row, the gate of the top selected transistor 211 of each memory string 210 may be coupled to the same string selected line 430; in some examples, gates of top selected transistors 211 of some of the multiple row of memory strings 210 may be coupled to the same string selected line 430; the memory strings 210 with top selected transistors 211 having gates coupled to the same string selected line 430 may constitute a memory slice. The gate of the bottom selected transistor 214 of each memory string 210 may be coupled to the same ground selected line 460. In some examples, the selected memory string 210 may be activated during the read operation and the program operation through the string selected line 430 and the ground selected line 460.

Each memory string 210 is coupled to the peripheral circuit 120 through the corresponding bit line 410, e.g., the drain of the top selected transistor 211 in the memory string 210 is coupled to the bit line 410. In order to reduce the number of bit lines 410, the memory strings 210 in any row may be coupled to the same bit line 410 as the memory strings 210 at corresponding locations in other rows.

For multiple memory strings 210 in the memory block 200, the control gate of the memory cell 212 in any memory string 210 and the control gate of the memory cell 212 at corresponding locations in other memory strings 210 may be coupled to the same word line 440. The source of the bottom selected transistor 214 in the memory string 210 may be coupled to the common source line (CSL) 420.

It is to be noted that the drawings of the present application only illustrate the structure of the memory block 200 of some examples, but in practice, the structure of the memory block 200 may also be other forms.

Figure 4:
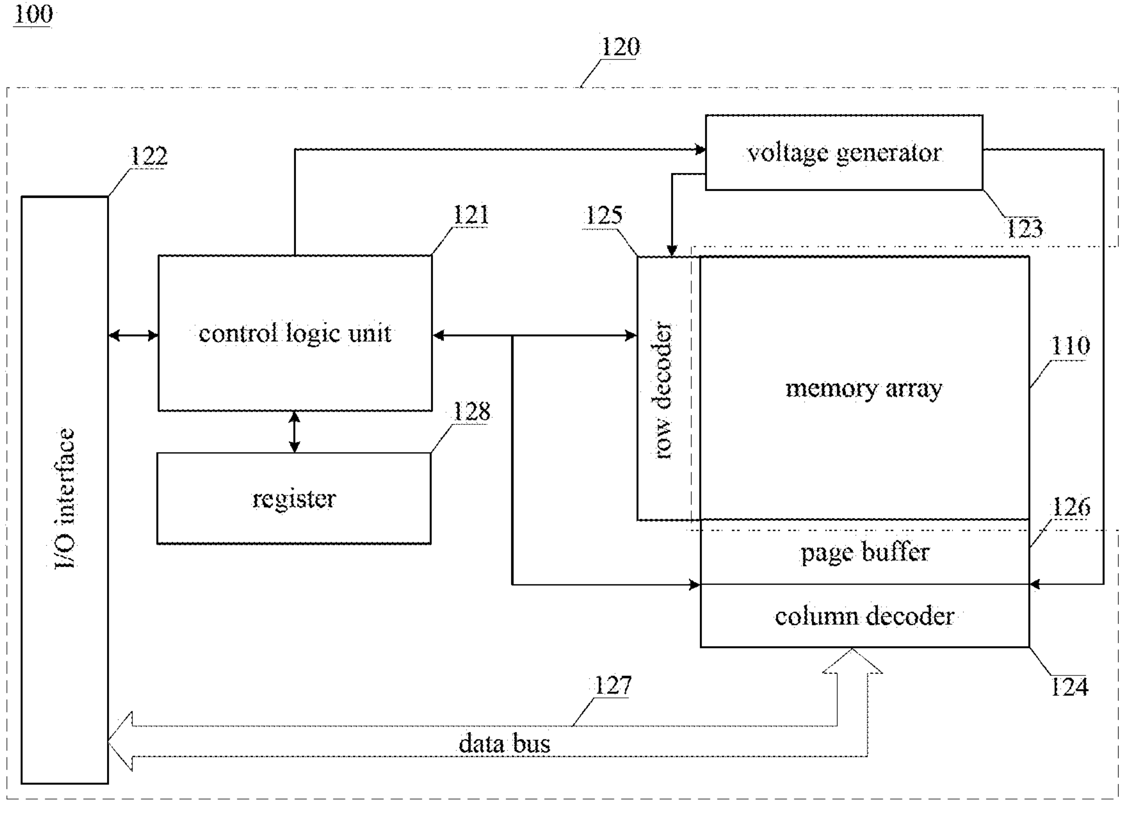
FIG. 4 is a structure schematic diagram of a memory device and peripheral circuits provided by an example of the present application.

As shown in FIG. 4, in some examples, the peripheral circuit 120 includes a control logic unit 121, an I/O interface 122, a voltage generator 123, a column decoder 124, a row decoder 125, a page buffer 126, a data bus 127, and a register 128. It is to be understood that in some examples, additional circuits not shown in FIG. 4 may also be included.

The control logic circuit (control logic unit) 121 may be coupled to voltage generator 123, page buffer 126, column decoder 124, row decoder 125, I/O interface 122, etc., and configured to control operation of various peripheral circuits. The control logic unit 121 may generate an operating signal in response to a received command (CMD) or control signal to control operation of the row decoder 125, the column decoder 124, the page buffer 126, and the voltage generator 123; wherein the command may be a program command, a read command, etc.

I/O interface 122 may be coupled to control logic unit 121 and act as a control buffer to buffer and relay a received control command to control logic unit 121 and to buffer and relay status information received from the control logic unit 121 to the host. I/O Interface 122 may also be coupled to page buffer 126 via data bus 127 and act as a data I/O interface 122 and data buffer to buffer and relay data to/from memory array 110.

The voltage generator 123 may use an external power supply voltage or an internal power supply voltage to generate various voltages for performing operations such as erase, program, read, and verify on the memory array 110, e.g., a program voltage Vpgm, an erase voltage Vera, a ground voltage Vss, etc., applied to the word line 440, and combinations thereof.

Column decoder 124 may be controlled in response to control logic and select one or more memory strings 210 in memory array 110 through applying bit line 410 voltages generated from voltage generator 123.

The row decoder 125 may, in response to the control by the control logic circuit, supply the word line 440 voltage generated from the voltage generator 123 to the selected word lines and unselected word lines of the memory array 110. As described in detail below, row decoder 125 is configured to perform program operations on memory device 100 cells coupled to one or more selected word lines in memory array 110.

The page buffer 126 is coupled to the memory array 110 through the bit line 410. In some examples, the page buffer 126 may read data from and program (write) data to the memory array 110 according to a control signal from the control logic circuit. In some other examples, the page buffer 126 may store program data (written data) to be programmed into memory array 110. In still other example, page buffer 126 may further perform a program verify operation to ensure that data has been correctly programmed into memory cell 212 coupled to the selected word line.

The register 128 may be coupled to the control logic circuit 512 and include status register, command register and address register for storing status information, command operation code (OP code) and command address for controlling operations of each of the peripheral circuits 120.

It will be understood by those skilled in the art that the operations performed by the row decoder 125, the page buffer 126, the control logic unit 121, and the voltage generator 123 described in the present application may be performed by a processing circuit. The processing circuit may include, but is not limited to, hardware of a logic circuit or a hardware/software combination of a processor that executes software.

The peripheral circuit 120 is configured to control the memory array 110; e.g., the peripheral circuit 120 may perform a program operation on the memory cell 212 in the memory array 110 to make the memory cell 212 store charge to implement writing data "0". The peripheral circuit 120 may perform an erase operation on the memory cell 212 to remove (or neutralize) the charge stored in the memory cell 212 to implement writing data "1". The peripheral circuit 120 may also perform a read operation on the memory cell 212 in the memory array 110 to read the data stored in the memory cell 212.

In some examples, the program operation of the memory cell 212 may include multiple program cycles. In some examples, a single program cycle may include a channel preparation phase (also referred to as a pre-charge phase) and a program phase. In other examples, a single program cycle may include a channel preparation phase, a program phase, and a verify phase.

In some examples, during the program phase, a program voltage Vpgm is applied to a selected word line (selected WL), and a pass voltage Vpass is applied to an unselected word line (unselected WL), wherein the pass voltage Vpass is less than the program voltage Vpgm. Meanwhile, a program select voltage (e.g., a program select voltage of 0V) is applied to the bit line 410 coupled to the memory cell 212 to be programmed, a large voltage difference between the gate and the channel of the memory cell 212 is caused by the program voltage Vpgm and the program select voltage, so that hot carriers may be injected into the floating gate layer (or, charge well) of the memory cell 212 to implement the program for the memory cell 212. A program inhibition voltage (e.g., a program inhibition voltage of 2V) is applied to the bit line 410 coupled to the memory cell 212 to be prohibited from programming, the program inhibition voltage is used to reduce the voltage difference between the gate and the channel of the memory cell 212, and prevent hot carriers from being injected into the floating gate layer (or, charge well) of the memory cell 212, so as to prohibit the program for the memory cell 212.

In the program phase described above, since the program voltage Vpgm is usually high, hot carrier injection (HCl) may also occur for the program-prohibited memory cell 212 coupled to the selected word line, thereby causing the threshold voltage of the program-inhibited memory cells 212 coupled to the selected word line to shift, and thereby affecting the subsequent program and data read of these memory cells 212, that is, generating program disturb on these memory cells 212.

In addition, in the program phase described above, although the pass voltage Vpass loaded on the unselected word line is lower than the program voltage Vpgm, hot carrier injection may also occur for the electrons in the channel of the memory cell 212 coupled to the unselected word line, thereby generating pass voltage disturb (Vpass disturb).

The two types of disturbance described above will reduce the reliability of the memory device 100, and in order to reduce the two types of disturbs described above, the reliability of the memory device 100 is improved. In the channel preparation phase before the program phase, the channel of the memory device 100 is precharged to raise the channel potential. Therefore, in the subsequent program phase, the voltage difference between the channel and the control gate of the program-prohibited memory cell 212 is reduced, thereby reducing the hot carrier injection effect of the program-prohibited memory cell 212, that is, reducing the two types of interference described above and improving the reliability of the memory device 100.

Figure 5:
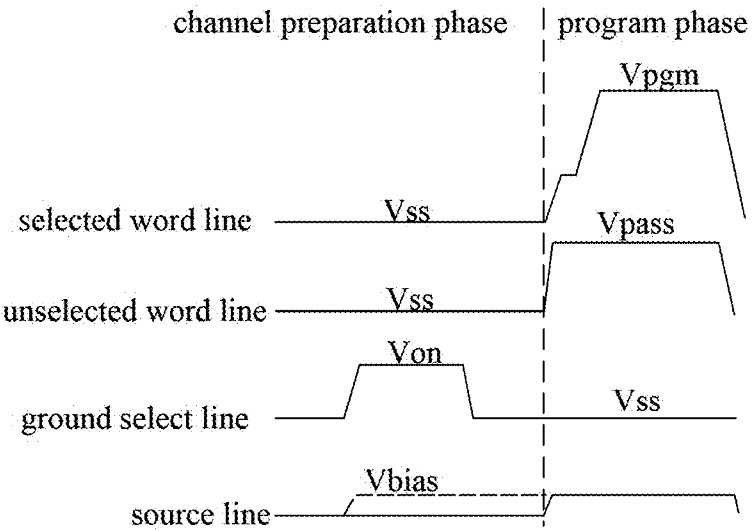
FIG. 5 is a schematic diagram of partial voltage application for a program operation provided by an example of the present application.

In some examples, the channel of the memory string 210 may be charged with an array common source (ACS) precharge mode in the channel preparation phase. As shown in FIG. 5, in the channel preparation phase, a turn-on voltage Von is applied to the gate of the bottom selected transistor 214 of the memory string 210 through the ground selected line 460 to enable the bottom selected transistor 214 of each memory string 210 to be turned on. Meanwhile, a precharge voltage Vbias is applied to the source line 420 of all memory strings 210, so that the precharge voltage Vbias is loaded to the channel of the memory string 210 through the turned-on bottom selected transistor 214 to achieve the purpose of precharging all memory strings 210.

Continuing to refer to FIG. 5, and in some implementations, for the word line 440 coupled to the memory block 200, the peripheral circuit 120 applies a ground voltage Vss to the word line 440 coupled to the memory block 200 in the channel preparation phase. Because the threshold voltage of the programmed memory cell is higher. Therefore, when the ground voltage Vss is applied to the word line 440 coupled to the programmed memory cell, the programmed memory cell is placed in a cut-off state. Meanwhile, because the threshold voltage of the unprogrammed memory cell is low. Therefore, when the ground voltage Vss is applied to the word line 440 coupled to the unprogrammed memory cell, the unprogrammed memory cell is in a turned-on state. Thus, a large potential difference is generated between the channel of the programmed memory cell and the channel of the unprogrammed memory cell, resulting in a hot carrier injection effect in the channel, which causes threshold voltage of the unprogrammed memory cell to shift.

Figure 6:
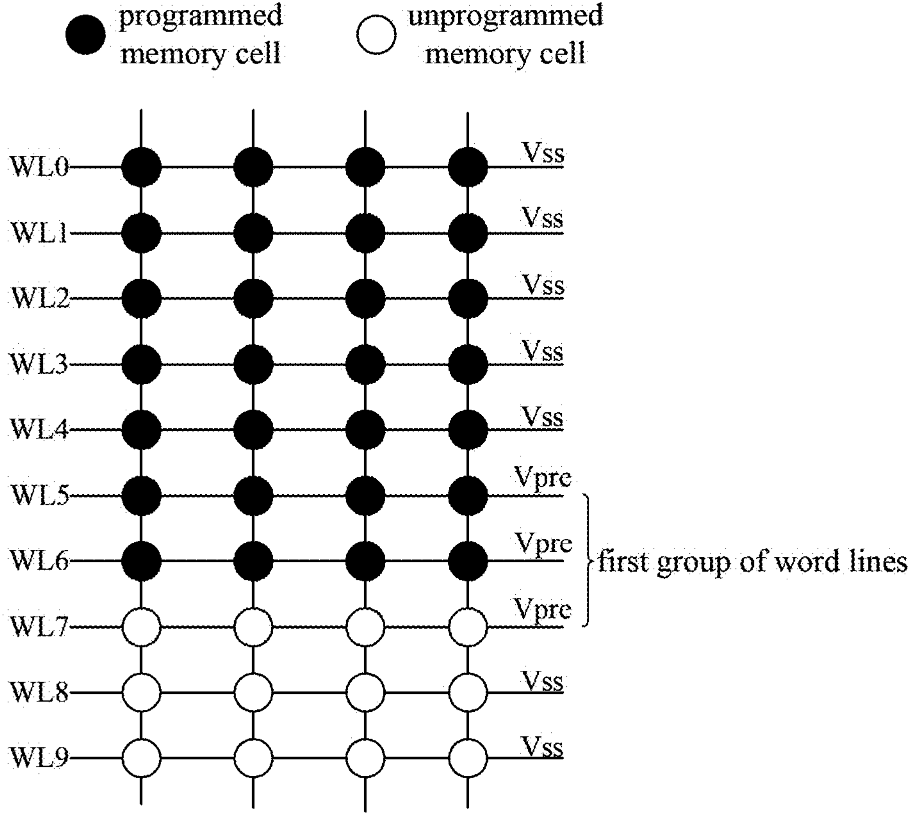
FIG. 6 is a schematic diagram of a voltage applied to each word line in the channel preparation phase provided by an example of the present application.

In order to reduce the hot carrier injection effect in the channel preparation phase. As shown in FIG. 6, in some implementations, during the channel preparation phase, a voltage Vpre is applied to the first group of word lines in the word line 440 coupled to the memory block 200; wherein the first group of word lines includes a word line 440 coupled to the memory cell to be programmed, and one or more word lines 440 coupled to the programmed memory cell adjacent to the memory cell to be programmed. The voltage Vpre is greater than the ground voltage Vss, so that in the channel preparation phase, through applying the voltage Vpre to the first group of word lines, the programmed memory cells adjacent to the unprogrammed memory cells are turned on to reduce the potential difference between the channel of the programmed memory cells and the channel of the unprogrammed memory cells, and weak the hot carrier injection effect in the channel. However, in the programmed memory cells, a certain potential difference will also be generated between the channel of the programmed memory cells coupled to the first group of word lines and the channel of other programmed memory cells, therefore there will also be a certain hot carrier injection effect.

A method for operating a memory device is provided in an implementation of the present application. In some examples, the operating method may include the peripheral circuit 120 performing a program operation on a third memory cell in the memory block 200.

In some examples, the program mode in which the peripheral circuit 120 performs a program operation on the third memory cell may be a multi-level program mode. The memory cell 212 (which may be referred to as a multi-level cell) employing the multi-level program mode may store two bits (i.e., 2 bits) or more and may have four states or more. For example, the memory cell 212 (which may be referred to as a triple-level cell (TLC)) employing the three-level program mode is able to store three bits of data and may have eight states (e.g., seven program (P) states (e.g., P1 state-P7 state) and one erase (E) state). The memory cell 212 (which may be referred to as a quad-level cell (QLC)) employing the four-level program mode is able to store four bits of data and may have sixteen states (e.g., fifteen program states (e.g., P1 state-P15 state) and one erase state).

Figure 7:
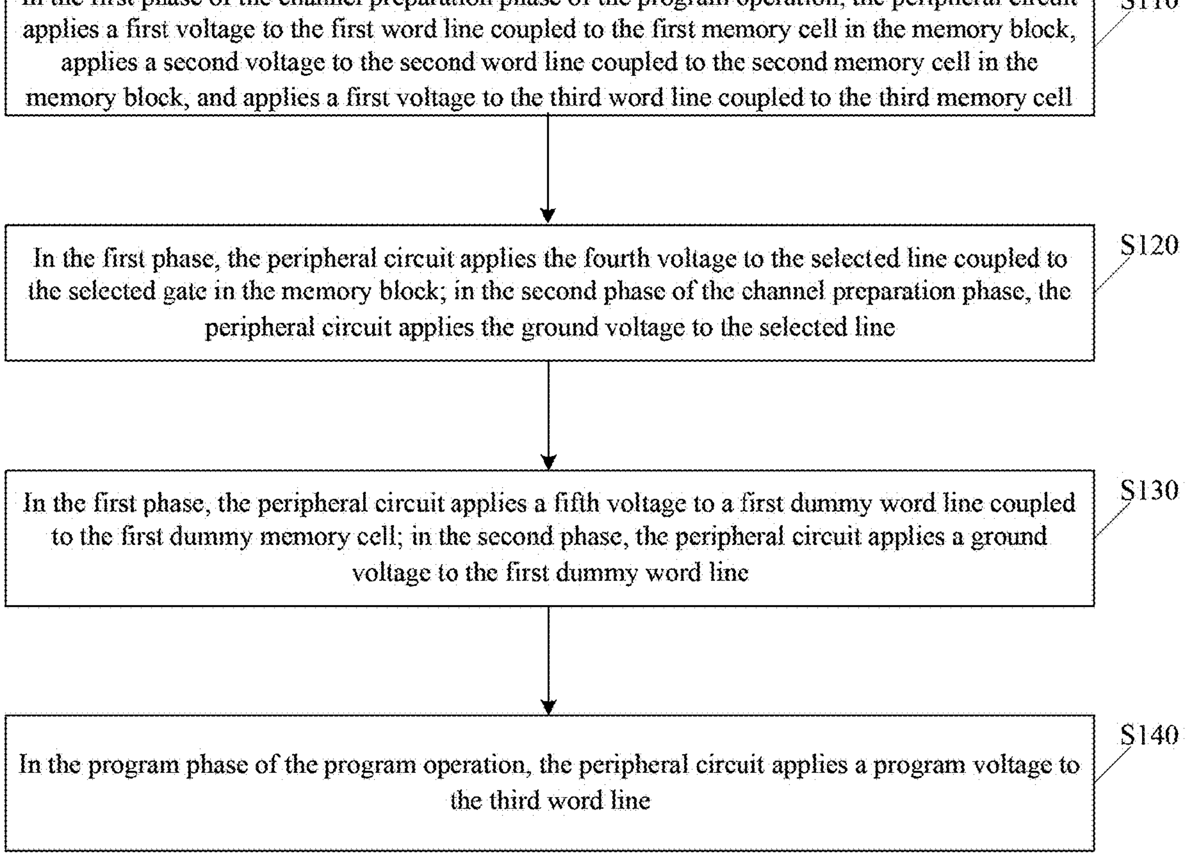
FIG. 7 is a flow diagram of an operating method provided by an example of the present application.

As described above, the program operation includes multiple program cycles, and a single program cycle may include at least a channel preparation phase and a program phase, and the program phase follows the channel preparation phase. In the channel preparation phase, the channel of the memory device 100 is precharged to raise the channel potential, thereby reducing the program interference caused by the hot carrier injection effect in the program phase. As shown in FIG. 7, in the operating method provided by the implementation of the present application, the peripheral circuit 120 performs a program operation on the third memory cell in the memory block 200, which may include operations S110-S140 as follows:

S110. In the first phase of the channel preparation phase of the program operation, the peripheral circuit applies a first voltage to the first word line coupled to the first memory cell in the memory block, applies a second voltage to the second word line coupled to the second memory cell in the memory block, and applies a first voltage to the third word line coupled to the third memory cell.

Figure 8:
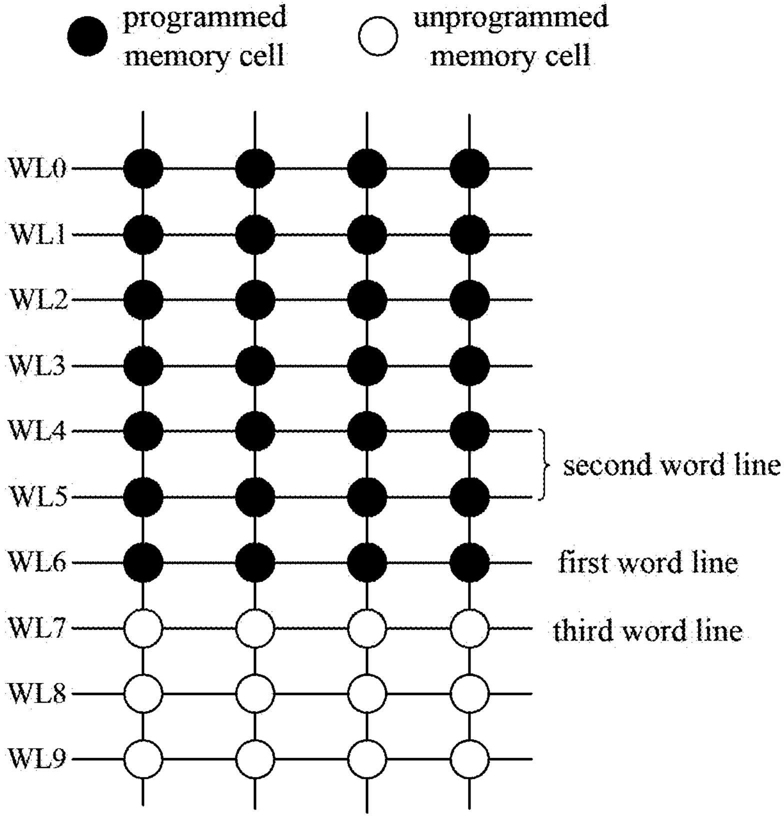
FIG. 8 is a schematic diagram of a possible location relationship among the first word line, the second word line and the third word line provided by an example of the present application.

In some implementations, the first memory cell and the second memory cell are both programmed memory cells. As shown in FIG. 8, the first word line includes one or more word lines 440 adjacent to the third word line, and the second word line includes one or more word lines 440 adjacent to the first word line. Among them, the first word line (e.g., WL6 in FIG. 8) is located between the third word line (e.g., WL7 in FIG. 8) coupled to the third memory cell and the second word line (e.g., WL4 and WL5 in FIG. 8).

In the implementation of the present application, the first voltage V1 is greater than the second voltage V2. Thus, in the channel preparation phase, the channel potential difference between the channel of the memory cell 212 coupled to the first word line and the channel of the memory cell 212 coupled to the second word line is reduced. Thus, the hot carrier injection effect between the programmed memory cells in the channel preparation phase is weakened, and the reliability of the memory device 100 is improved.

Figure 9:
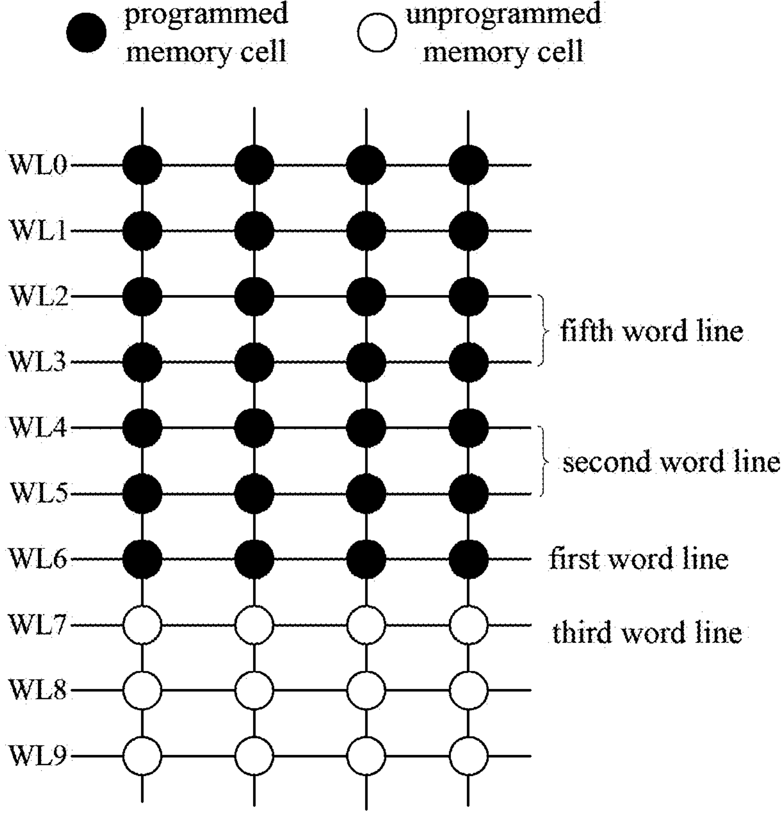
FIG. 9 is a schematic diagram of a possible location relationship among the first word line, the second word line, the third word line and the fifth word line provided by an example of the present application.

It is to be understood that in order to better weak or even eliminate the hot carrier injection effect in the channel preparation phase, during the channel preparation phase, voltages which are stepped down may be sequentially applied to the word lines 440 coupled to the programmed memory cells in a direction away from the third word line. In some examples, the programmed memory cells also include a fifth memory cell. As shown in FIG. 9, the fifth word line coupled to the fifth memory cell (e.g., WL2 and WL3 in FIG. 9) includes one or more word lines 440 adjacent to the second word line, and the second word line is located between the first word line and the fifth word line. In some implementations, the sum of the number of first word lines, the number of second word lines, and the number of fifth word lines is greater than 4 and less than 40.

Figure 10:
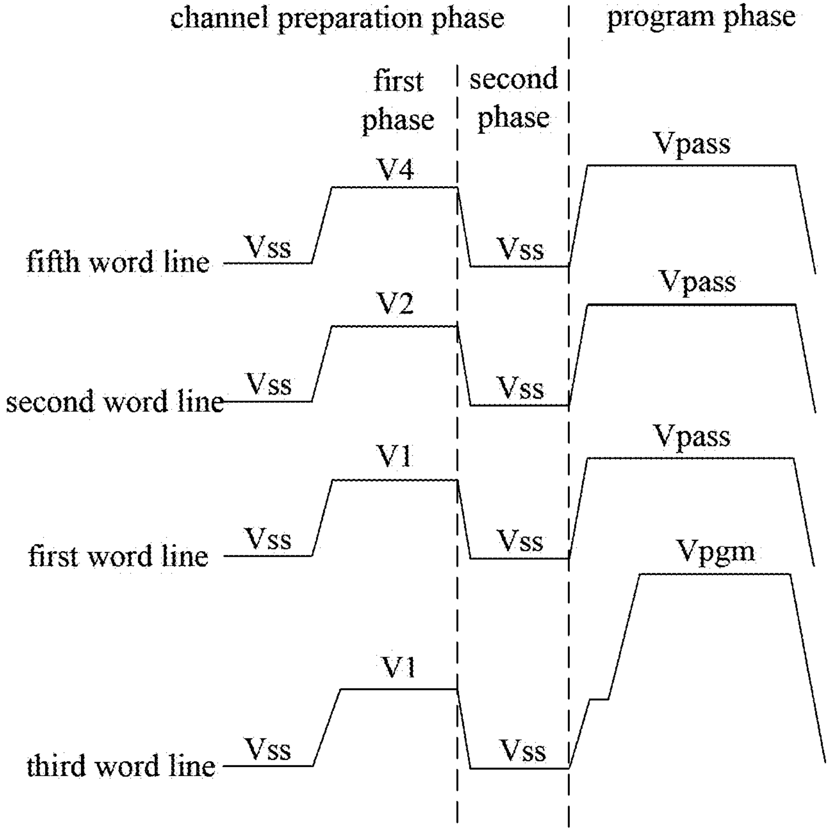
FIG. 10 is a schematic diagram of a first application of partial voltage for a coarse program operation provided by an example of the present application.

As shown in FIG. 10, in the first phase of the channel preparation phase, the peripheral circuit 120 applies a first voltage V1 to the first word line and the third word line, applies a second voltage V2 to the second word line, and applies a fourth voltage V4 to the fifth word line, and the fourth voltage V4 is greater than the ground voltage Vss. In some implementations, the values of the first voltage V1, the second voltage V2, and the fourth voltage V4 are between 0V and 6V, and the first voltage V1 is greater than the second voltage V2, the second voltage V2 is greater than the fourth voltage V4.

Please continue to refer to FIG. 10, and in some implementations, during the second phase of the channel preparation phase (the second phase follows the first phase), the peripheral circuit 120 applies the ground voltage Vss to the third word line, the first word line, the second word line, and the fifth word line.

Figure 11:
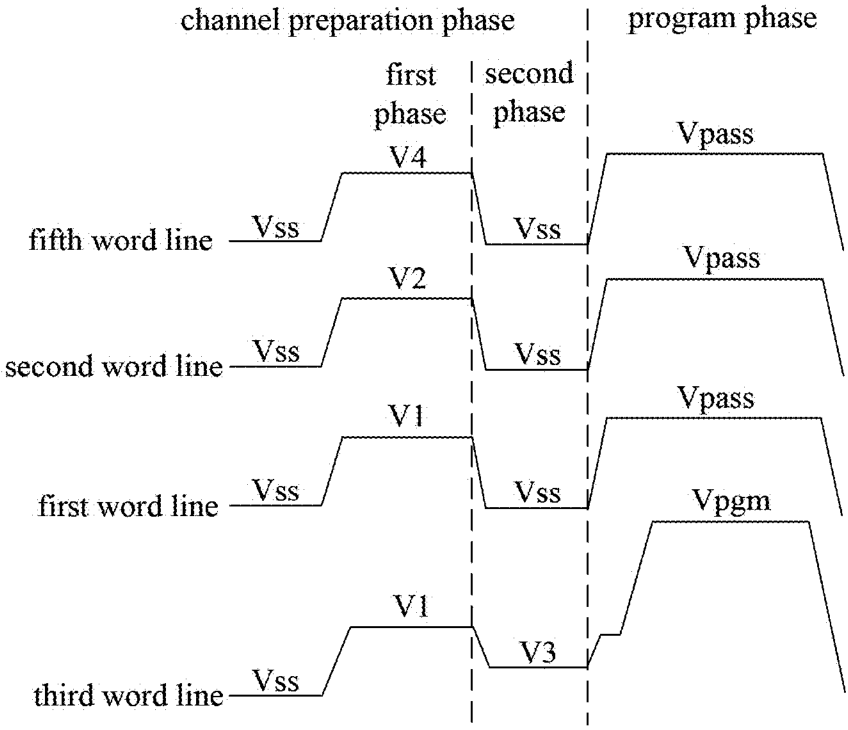
FIG. 11 is a schematic diagram of a second application of partial voltage for a coarse program operation provided by an example of the present application.

As shown in FIG. 11, in other implementations, in the second phase of the channel preparation phase, the peripheral circuit 120 applies the third voltage V3 to the third word line, and applies the ground voltage Vss to the first word line, the second word line, and the fifth word line.

Figure 12:
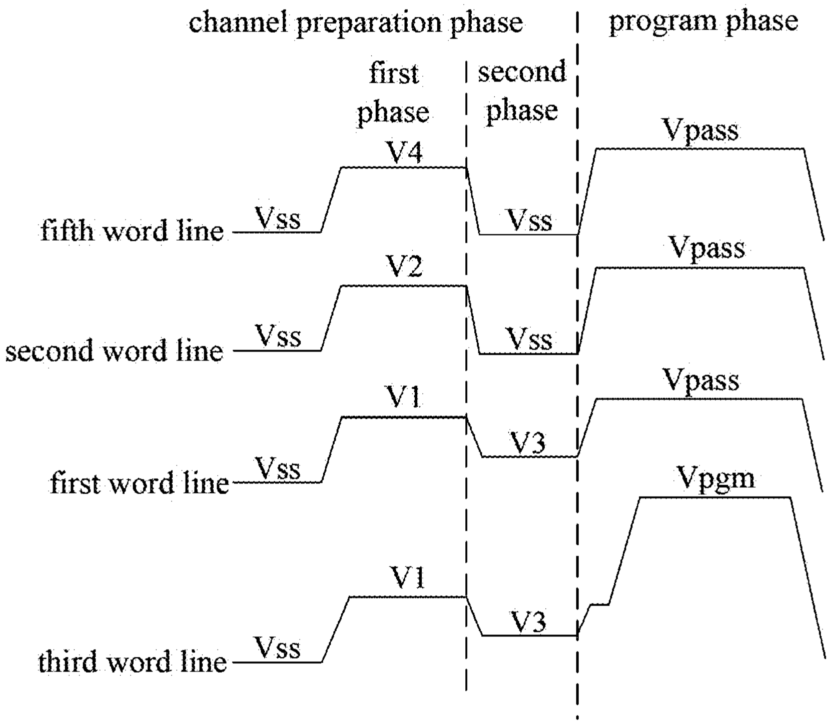
FIG. 12 is a schematic diagram of a third application of partial voltage for a coarse program operation provided by an example of the present application.

As shown in FIG. 12, in other implementations, in the second phase of the channel preparation phase, the peripheral circuit 120 applies the third voltage V3 to the third word line and the first word line, and applies the ground voltage Vss to the second word line and the fifth word line. The first voltage V1 is greater than the third voltage V3, and the third voltage V3 is greater than the ground voltage Vss.

The program operation of the peripheral circuit 120 on the third memory cell may be a coarse program operation or a fine program operation. Coarse program may be used together with fine program to achieve a strict threshold distribution without slowing down the program process of the memory cell too much. During the coarse program operation, the third memory cell is an unprogrammed memory cell. When coarse program is being performed on the peripheral circuit 120, the voltage waveform applied by the peripheral circuit 120 to the word line 440 may be as shown in any one of FIG. 10-FIG. 12.

Figure 13:
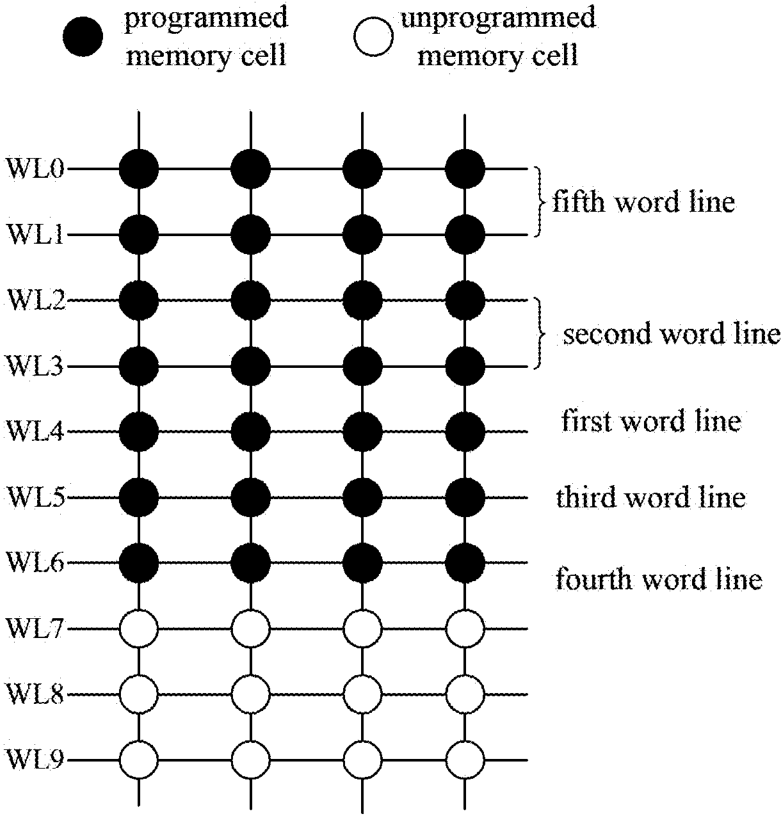
FIG. 13 is a schematic diagram of a possible location relationship among the first word line, the second word line, the third word line, the fourth word line and the fifth word line provided by an example of the present application.
Figure 14:
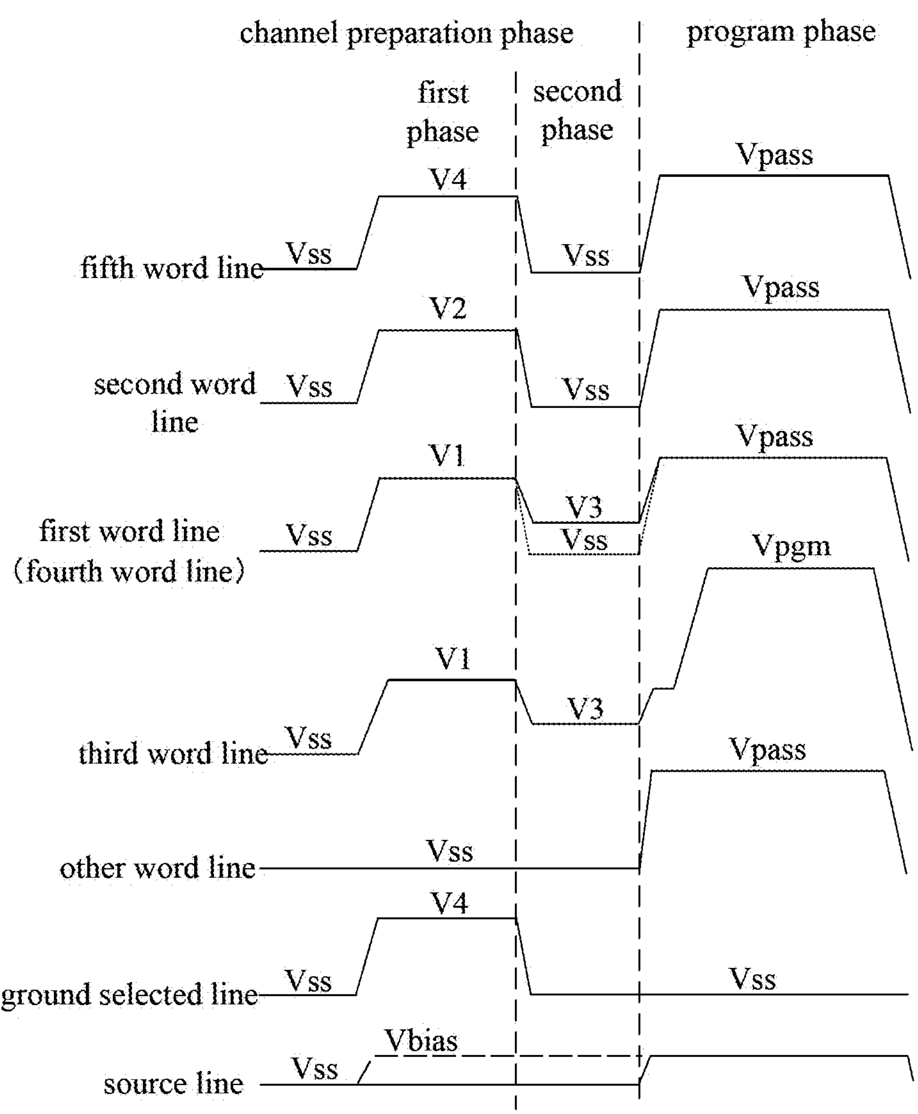
FIG. 14 is a schematic diagram of partial voltage application for a fine program operation provided by an example of the present application.

Differing from the coarse program operation, during the fine program operation, the third memory cell is a programmed memory cell, and at this point, the programmed memory cells also include the fourth memory cell. As shown in FIG. 13, the fourth word line coupled to the fourth memory cell (e.g., WL6 in FIG. 13) is located between the word line 440 coupled to the unprogrammed memory cells in the memory block 200 (e.g., WL7-WL9 in FIG. 13) and the third word line (e.g., WL5 in FIG. 13). As shown in FIG. 14, in some examples, when the peripheral circuit 120 is being fine-programmed, in the first phase, the peripheral circuit 120 also applies a first voltage V1 to the fourth word line coupled to the fourth memory cell; in the second phase, the peripheral circuit 120 applies a ground voltage Vss, or a third voltage V3 to the fourth word line. That is, in the channel preparation phase, the voltage waveform on the fourth word line may be the same as the voltage waveform on the first word line.

Continuing to refer to FIG. 14, and in some examples, for other word lines coupled to unprogrammed memory cells in the memory block 200, in the channel preparation phase (including the first phase and the second phase), the peripheral circuit 120 applies the ground voltage Vss to the other word lines coupled to the unprogrammed memory cells.

S120. In the first phase, the peripheral circuit applies the fourth voltage to the selected line coupled to the selected transistor in the memory block; in the second phase of the channel preparation phase, the peripheral circuit applies the ground voltage to the selected line.

As shown in FIG. 14, in some examples, the selected line may be the ground selected line 460 coupled to the bottom selected transistor 214. The fourth voltage V4 is greater than the ground voltage Vss, during the first phase, the peripheral circuit 120 turns on the bottom selected transistor 214 coupled to the ground selected line 460 by applying the fourth voltage V4 to the ground selected line 460, thereby charging the channel of the memory string 210 through the source line 420 to increase the channel potential. In the second phase of the channel preparation phase, the peripheral circuit 120 applies the ground voltage Vss to the ground selected line 460, thereby turning off the bottom selected transistor 214 coupled to the ground selected line 460, and completes charging the channel of the memory string 210.

S130. In the first phase, the peripheral circuit applies a fifth voltage to a first dummy word line coupled to the first dummy memory cell; in the second phase, the peripheral circuit applies a ground voltage to the first dummy word line.

As described above, the memory string 210 also includes a dummy memory cell 213, and through setting the dummy memory cell 213, the program interference, read failure and erase failure among other things caused by coupling noise may be reduced. In some examples, the dummy memory cell 213 includes a first dummy memory cell, the first dummy memory cell is adjacent to the bottom selected transistor 214, and the fifth voltage V5 is greater than the ground voltage Vss. That is, in the first phase, the peripheral circuit 120 also needs to turn on the first dummy memory cell coupled to the first dummy word line through applying the fifth voltage V5 to the first dummy word line, so as to charge the channel of the memory string 210 through the source line 420 to increase the channel potential.

As shown in FIG. 3, in some examples, the memory string 210 may include a first deck, a second deck and a third deck. The first deck is adjacent to the second deck, the second deck is adjacent to the third deck, and the second deck is located between the first deck and the third deck. In some examples, the dummy memory cell 213 further includes a second dummy memory cell located in a joint between the second deck and the third deck, and a third dummy memory cell located in a joint between the first deck and the second deck.

Figure 15:
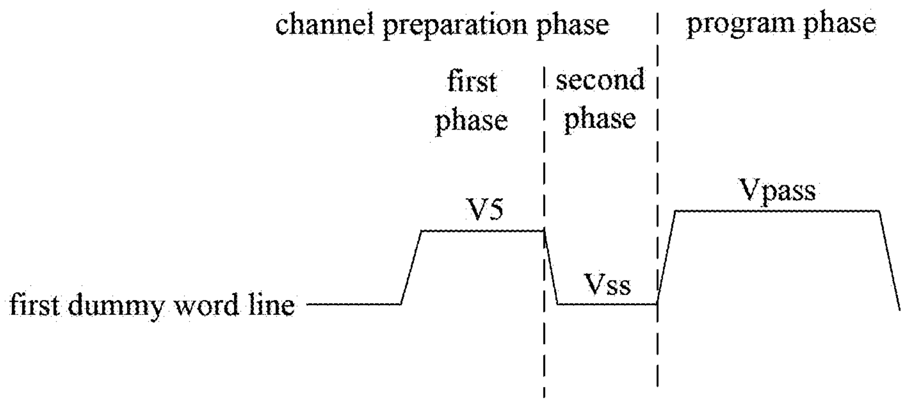
FIG. 15 is a schematic diagram of a first application of dummy word line voltage for a program operation provided by an example of the present application.

When the third memory cell is located in the third deck, and the memory cell 212 in the second deck and the memory cell 212 in the third deck are both programmed memory cells, the voltage waveform applied by the peripheral circuit 120 to the dummy word line 450 may be as shown in FIG. 15. As shown in FIG. 15, in the first phase, the peripheral circuit 120 applies a fifth voltage V5 to a first dummy word line coupled to the first dummy memory cell; in the second phase, the peripheral circuit 120 applies a ground voltage Vss to the first dummy word line.

Figure 16:
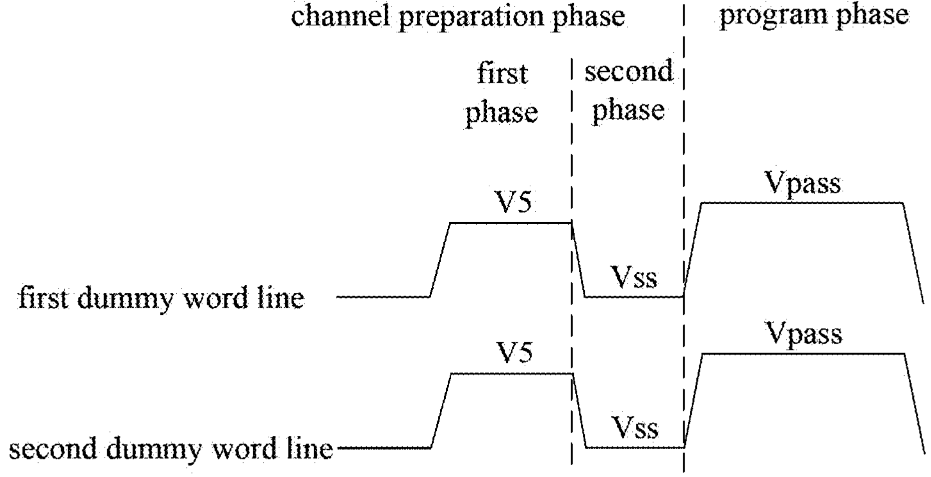
FIG. 16 is a schematic diagram of a second application of dummy word line voltage for a program operation provided by an example of the present application.

When the third memory cell is located in the second deck, the memory cell 212 in the first deck is a programmed memory cell, and all of the memory cells 212 in the third deck are unprogrammed memory cells, the voltage waveform applied by the peripheral circuit 120 to the dummy word line 450 may be as shown in FIG. 16. As shown in FIG. 16, in the first phase, the peripheral circuit 120 applies the fifth voltage V5 to the first dummy word line and the second dummy word line coupled to the second dummy memory cell. In the second phase, the peripheral circuit 120 applies the ground voltage Vss to the first dummy word line and the second dummy word line.

Figure 17:
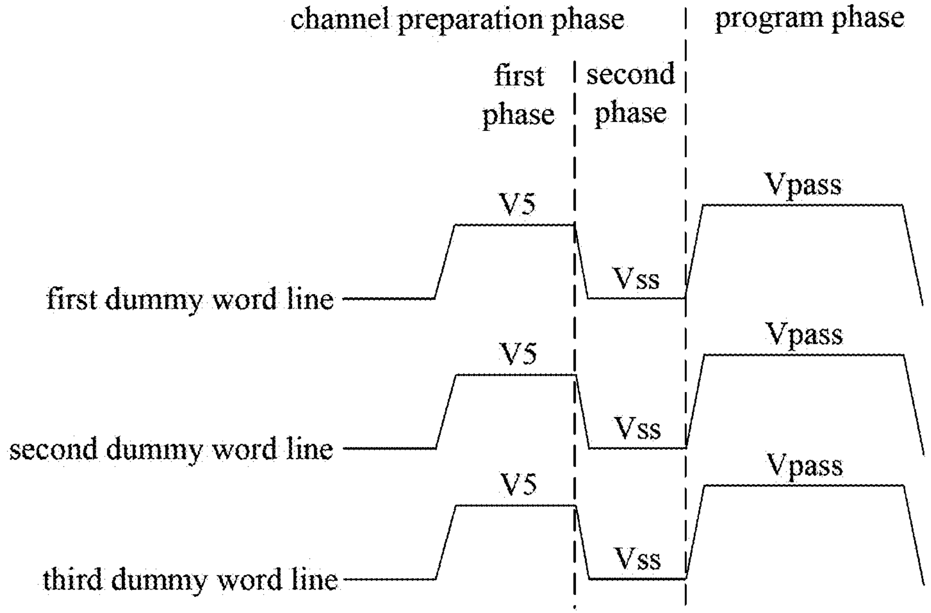
FIG. 17 is a schematic diagram of a third application of dummy word line voltage for a program operation provided by an example of the present application.

When the third memory cell is located in the first deck, and the memory cells 212 in the second deck and the memory cells 212 in the third deck are both unprogrammed memory cells, the voltage waveform applied by the peripheral circuit 120 to the dummy word line 450 may be as shown in FIG. 17. As shown in FIG. 17, in the first phase, the peripheral circuit 120 applies a fifth voltage V5 to the first dummy word line, the second dummy word line, and the third dummy word line coupled to the third dummy memory cell. In the second phase, the peripheral circuit 120 applies a ground voltage Vss to the first dummy word line, the second dummy word line, and the third dummy word line.

S140. In the program phase of the program operation, the peripheral circuit applies a program voltage to the third word line.

In some examples, the third word line may be referred to as a selected word line, and among the word lines 440 coupled to the memory block 200, the word lines 440 other than the third word line may be referred to as unselected word lines. As shown in FIG. 14, in the program phase of the program operation, the peripheral circuit 120 applies a program voltage Vpgm to the third word line and a pass voltage to the unselected word line. The program voltage Vpgm is greater than the first voltage V1, and the program voltage Vpgm is greater than the pass voltage Vpass.

Figure 18:
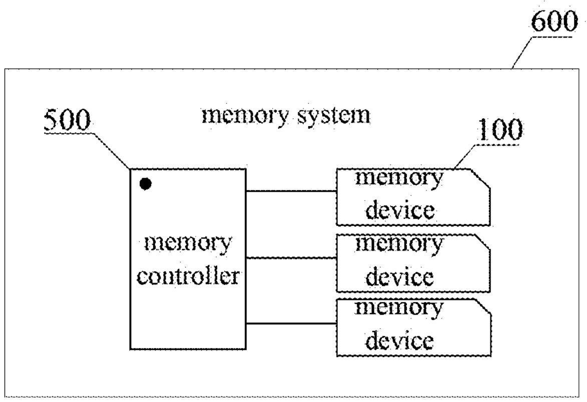
FIG. 18 is a structure schematic diagram of a memory system provided by an example of the present application.

As shown in FIG. 18, an example of the present application provides a memory system 600, the memory system 600 includes a memory controller 500 and a memory device 100. The memory controller 500 is coupled to the memory device 100, and in some examples, the memory controller 500 may send various commands (e.g., program command, read command and erase command, etc.) to the memory device 100 based on instructions received from the host to control operations (e.g., program operation, read operation, and erase operation, etc.) of the memory device 100. Wherein, when the memory device 100 performs a program operation, the peripheral circuit 120 in the memory device 100 may perform the method shown in FIG. 7.

It is to be understood that, memory controller 500 may also be configured to manage various functions related to data stored or to be stored in memory device 104, including but not limited to bad block management, garbage collection, logical-to-physical address translation, wear leveling, etc. Of course, the memory controller 500 may also perform any other suitable functions (e.g., formatting the memory device 100), which will not be described in detail in the present application.

In some examples, the memory controller 500 and one or more memories 100 may be packaged as different types of electronic products. In some examples, memory controller 500 and single memory device 100 may be integrated into a memory card. The memory card may include a personal computer memory card (PCMCIA card), a compact flash (CF) card, a smart media (SM) card, a memory stick, a multi-media card (MMC), and a secure digital (SD) card, etc. The memory card may further include a memory card connector that couples the memory card to a host. In other examples, the memory controller 500 and the multiple memories 100 may be integrated into a solid state disk (SSD). The solid state disk may further include a solid state disk connector that couples the solid state disk to a host. In some implementations, the storage capacity and/or operating speed of the solid state disk is greater than the storage capacity and/or operating speed of the memory card.

The memory controller 500 may communicate with an external device (e.g., a host) through at least one of various interface protocols. The interface protocol may include at least one of universal serial bus (USB) protocol, multi media card (MMC) protocol, peripheral component interconnect (PCI) protocol, PCI Express (PCI-E) protocol, advanced technology attachment (ATA) protocol, serial ATA protocol, parallel ATA protocol, small computer system interface (SCSI) protocol, enhanced small disk interface (ESDI) protocol, integrated drive electronics (IDE) protocol, etc.

In some implementations, the memory system 600 may be applied to and packaged in different types of electronic devices, e.g., a mobile phones (e.g., a cell phone), a desktop computer, a tablet computer, a notebook computer, a server, a vehicle-mounted equipment, a game console, a printer, a positioning device, a wearable device, a smart sensor, a power bank, a virtual reality (VR) device, an augmented reality (AR) device, servers, and any other electronic devices that can store data.

Examples of the present application provide a memory device, a method for operating a memory device and a memory system. The memory includes a memory array and a peripheral circuit coupled to the memory array, the memory array includes a memory block, and the memory block is coupled to the peripheral circuit through a word line. Wherein, the memory block includes programmed memory cells and an unprogrammed memory cell, and the programmed memory cells include a first memory cell and a second memory cell. The peripheral circuit is configured to: perform a program operation on a third memory cell in the memory block, apply a first voltage to a first word line coupled to the first memory cell in a first phase of a channel preparation phase of the program operation; and apply a second voltage to a second word line coupled to the second memory cell. Wherein, the first word line is located between a third word line coupled to the third memory cell and the second word line, and the first voltage is greater than the second voltage. Thus, in the channel preparation phase, the channel potential difference between the channel of the memory cell coupled to the first word line and the channel of the memory cell coupled to the second word line is reduced. Thus, the hot carrier injection effect between the programmed memory cells in the channel preparation phase is weakened, and the reliability of the memory device is improved.

An example of the present application provides a computer-readable storage medium, the computer-readable storage medium stores computer-executable instructions; and the computer-executable instructions, after being executed, are able to implement the method as shown in FIG. 7.

An example of the present application provides a computer device, including a processor and a readable storage medium coupled to the processor, wherein the readable storage medium stores executable instructions that when being executed by the processor, are able to implement the method as shown in FIG. 7.

In a first aspect, a memory device is provided. The memory device includes a memory array and a peripheral circuit coupled to the memory array, the memory array includes a memory block, and the memory block is coupled to the peripheral circuit through a word line. Wherein, the memory block includes programmed memory cells and an unprogrammed memory cell, and the programmed memory cells include a first memory cell and a second memory cell. The peripheral circuit is configured to: perform a program operation on a third memory cell in the memory block, apply a first voltage to a first word line coupled to the first memory cell in a first phase of a channel preparation phase of the program operation; and apply a second voltage to a second word line coupled to the second memory cell. Wherein, the first word line is located between a third word line coupled to the third memory cell and the second word line, and the first voltage is greater than the second voltage.

In some implementations, the first word line includes one or more word lines adjacent to the third word line, and the second word line includes one or more word lines adjacent to the first word line.

In some implementations, the peripheral circuit is further configured to: apply a first voltage to the third word line in a first phase.

In some implementations, the peripheral circuit is further configured to: apply a ground voltage to the third word line, the first word line, and the second word line in the second phase of the channel preparation phase. Wherein the second phase follows the first phase.

In some implementations, the peripheral circuit is further configured to: apply a third voltage to the third word line in the second phase of the channel preparation phase. Wherein the second phase follows the first phase, the first voltage is greater than the third voltage, and the third voltage is greater than the ground voltage.

In some implementations, the peripheral circuit is further configured to: apply a ground voltage to the first word line and the second word line in the second phase.

In some implementations, the peripheral circuit is further configured to: apply the third voltage to the first word line and a ground voltage to the second word line in the second phase.

In some implementations, the programmed memory cells further include a fourth memory cell, and the peripheral circuit is further configured to: in the first phase, apply a first voltage to a fourth word line coupled to the fourth memory cell. In the second phase, a ground voltage, or a third voltage, is applied to the fourth word line. The fourth word line is located between the word line coupled to the unprogrammed memory cell and the third word line.

In some implementations, the programmed memory cells further include a fifth memory cell, and the peripheral circuit is further configured to: in the first phase, applying a fourth voltage to the fifth word line coupled to the fifth memory cell, the second voltage is greater than the fourth voltage. The fifth word line includes one or more word lines adjacent to the second word line, and the second word line is located between the first word line and the fifth word line.

In some implementations, the peripheral circuit is further configured to: apply a ground voltage to the fifth word line in the second phase of the channel preparation phase. Wherein the second phase follows the first phase, and the fourth voltage is greater than the ground voltage.

In some implementations, the first voltage is less than 6V, and the fourth voltage is greater than 0V.

In some implementations, the peripheral circuit is further configured to: in the channel preparation phase, apply a ground voltage to the word line coupled to the unprogrammed memory cell.

In some implementations, the memory block further includes a selected transistor, the peripheral circuit is further configured to: in the first phase, apply a fourth voltage to the selected line coupled to the selected transistor. In the second phase of the channel preparation phase, a ground voltage is applied to the selected line. Wherein the second phase follows the first phase, and the fourth voltage is greater than the ground voltage.

In some implementations, the peripheral circuit is further configured to: in a program phase of the program operation, apply a program voltage to a third word line coupled to the third memory cell. Wherein the program phase follows the channel preparation phase, and the program voltage is greater than the first voltage.

In a second aspect, a method for operating a memory device is provided. The memory device includes a memory array, the memory array includes a memory block, and the operating method includes: performing a program operation on a third memory cell in the memory block. In a first phase of a channel preparation phase of the program operation, a first voltage is applied to a first word line coupled to the first memory cell in the memory block; and a second voltage is applied to a second word line coupled to the second memory cell in the memory block. Wherein the first memory cell and the second memory cell are both programmed memory cells, the first word line is located between a third word line coupled to the third memory cell and the second word line, and the first voltage is greater than the second voltage.

In some implementations, the first word line includes one or more word lines adjacent to the third word line, and the second word line includes one or more word lines adjacent to the first word line.

In some implementations, the operating method further includes: applying the first voltage to the third word line in a first phase.

In some implementations, the operating method further includes: applying a ground voltage to the third word line, the first word line, and the second word line in the second phase of the channel preparation phase. Wherein the second phase follows the first phase.

In some implementations, the operating method further includes: applying a third voltage to the third word line in the second phase of the channel preparation phase. Wherein the second phase follows the first phase, the first voltage is greater than the third voltage, and the third voltage is greater than the ground voltage.

In some implementations, the operating method further includes: applying a ground voltage to the first word line and the second word line in the second phase.

In some implementations, the operating method further includes: applying the third voltage to the first word line and a ground voltage to the second word line in the second phase.

In some implementations, the programmed memory cells further include a fourth memory cell, and the operating method further includes: in the first phase, applying a first voltage to a fourth word line coupled to the fourth memory cell. In the second phase, a ground voltage, or a third voltage, is applied to the fourth word line. Wherein the fourth word line is located between the word line coupled to the unprogrammed memory cell in the memory block and the third word line.

In some implementations, the programmed memory cells further include a fifth memory cell, and the operating method further includes: in the first phase, applying a fourth voltage to the fifth word line coupled to the fifth memory cell, the second voltage is greater than the fourth voltage. Wherein the fifth word line includes one or more word lines adjacent to the second word line, and the second word line is located between the first word line and the fifth word line.

In some implementations, the operating method further includes: applying a ground voltage to the fifth word line in the second phase of the channel preparation phase. Wherein the second phase follows the first phase, and the fourth voltage is greater than the ground voltage.

In some implementations, the first voltage is less than 6V, and the fourth voltage is greater than 0V.

In some implementations, the operating method further includes: in the channel preparation phase, applying a ground voltage to the word line coupled to the unprogrammed memory cell in the memory block.

In some implementations, the operating method further includes: in the first phase, applying a fourth voltage to the selected line coupled to the selected transistor in the memory block; in the second phase of the channel preparation phase, applying a ground voltage to the selected line. Wherein the second phase follows the first phase, and the fourth voltage is greater than the ground voltage.

In some implementations, the operating method further includes: in a program phase of the program operation, applying a program voltage to a third word line coupled to the third memory cell. Wherein the program phase follows the channel preparation phase, and the program voltage is greater than the first voltage.

In a third aspect, a memory system is provided. The memory system includes a memory controller and a memory device of any one of the aspects described above, the memory controller is coupled to the memory device, and the memory controller is configured to control the memory device.

Those skilled in the art can clearly understand that, for the convenience and simplicity of description, in the examples described above, each example has its own emphasis in description, and for a part that are not described in detail in a certain example, reference may be made to the corresponding process in a foregoing method example, which will not be repeated here.

In the several examples provided by the present application, it is to be understood that the provided memory device, operating method for a memory device, and memory system may be implemented in other ways. For example, the division of a certain module is only a logical function division, and in actual implementation, there may be other division methods, such as multiple elements or components may be combined, or may be integrated into another system, or some features may be ignored, or not implemented.

Those of ordinary skill in the art may realize that the modules and algorithm operations of each example described in conjunction with the examples disclosed herein may be implemented with electronic hardware, or a combination of computer software and electronic hardware. Whether these functions are performed in hardware or software depends on the specific application and design constraints of the technical solution. Those of ordinary skill in the art may implement the described functionality by using different methods for each specific application, but such implementations should not be considered to be beyond the scope of the present application.

The above is only specific implementations of the present application, but the claimed scope of the present application is not limited thereto, and changes or substitutions within the technical scope disclosed in the present application that may be easily conceived by those skilled in the art shall fall within the claimed scope of the present application. Therefore, the claimed scope of the present application should be determined by the claimed scope of the claims.

What is claimed is:

1. A memory device including:

a memory array including a memory block coupled to a peripheral circuit through a word line, wherein the memory block includes programmed memory cells and an unprogrammed memory cell, the programmed memory cells include a first memory cell and a second memory cell; and the peripheral circuit coupled to the memory array and configured to:

perform a program operation on a third memory cell in the memory block;

apply a first voltage to a first word line coupled to the first memory cell in a first phase of a channel preparation phase of the program operation; and apply a second voltage to a second word line coupled to the second memory cell, wherein the first word line is located between a third word line coupled to the third memory cell and the second word line, and the first voltage is greater than the second voltage.

2. The memory device of claim 1, wherein the first word line includes one or more word lines adjacent to the third word line, and the second word line includes one or more word lines adjacent to the first word line.

3. The memory device of claim 1, wherein the peripheral circuit is further configured to apply the first voltage to the third word line in the first phase.

4. The memory device of claim 3, wherein the peripheral circuit is further configured to apply a ground voltage to the third word line, the first word line, and the second word line in a second phase of the channel preparation phase, wherein the second phase follows the first phase.

5. The memory device of claim 3, wherein the peripheral circuit is further configured to apply a third voltage to the third word line in a second phase of the channel preparation phase, wherein the second phase follows the first phase, the first voltage is greater than the third voltage, and the third voltage is greater than a ground voltage.

6. The memory device of claim 5, wherein the peripheral circuit is further configured to apply the ground voltage to the first word line and the second word line in the second phase.

7. The memory device of claim 5, wherein the peripheral circuit is further configured to apply the third voltage to the first word line and apply the ground voltage to the second word line in the second phase.

8. The memory device of claim 5, wherein the programmed memory cells further include a fourth memory cell, and the peripheral circuit is further configured to:

apply the first voltage to a fourth word line coupled to the fourth memory cell in the first phase; and apply the ground voltage or the third voltage to the fourth word line in the second phase, wherein the fourth word line is located between a word line coupled to the unprogrammed memory cell and the third word line.

9. The memory device of claim 1, wherein the programmed memory cells further include a fifth memory cell, and the peripheral circuit is further configured to apply a fourth voltage to a fifth word line coupled to the fifth memory cell in the first phase, wherein the second voltage is greater than the fourth voltage, and wherein the fifth word line includes one or more word lines adjacent to the second word line, and the second word line is located between the first word line and the fifth word line.

10. The memory device of claim 9, wherein the peripheral circuit is further configured to apply a ground voltage to the fifth word line in a second phase of the channel preparation phase, wherein the second phase follows the first phase, and the fourth voltage is greater than the ground voltage.

11. The memory device of claim 9, wherein the first voltage is less than 6V, and the fourth voltage is greater than 0V.

12. The memory device of claim 9, wherein the peripheral circuit is further configured to apply a ground voltage to a word line coupled to the unprogrammed memory cell in the channel preparation phase.

13. The memory device of claim 1, wherein the memory block further includes a selected transistor, and the peripheral circuit is further configured to:

apply a fourth voltage to a selected line coupled to the selected transistor in the first phase; and apply a ground voltage to the selected line in a second phase of the channel preparation phase, wherein the second phase follows the first phase, and the fourth voltage is greater than the ground voltage.

14. The memory device of claim 1, wherein the peripheral circuit is further configured to apply a program voltage to the third word line coupled to the third memory cell in a program phase of the program operation, wherein the program phase follows the channel preparation phase, and the program voltage is greater than the first voltage.

15. A method for operating a memory device, wherein the memory device includes a memory array, the memory array includes a memory block, and the method includes:

performing a program operation on a third memory cell in the memory block;

applying a first voltage to a first word line coupled to a first memory cell in the memory block in a first phase of a channel preparation phase of the program operation; and applying a second voltage to a second word line coupled to a second memory cell in the memory block, wherein the first memory cell and the second memory cell are both programmed memory cells, the first word line is located between a third word line coupled to the third memory cell and the second word line, and the first voltage is greater than the second voltage.

16. The method of claim 15, wherein the first word line includes one or more word lines adjacent to the third word line, and the second word line includes one or more word lines adjacent to the first word line.

17. The method of claim 15, further including applying the first voltage to the third word line in the first phase.

18. The method of claim 17, further including applying a third voltage to the third word line in a second phase of the channel preparation phase, wherein the second phase follows the first phase, the first voltage is greater than the third voltage, and the third voltage is greater than a ground voltage.

19. The method of claim 15, wherein the programmed memory cells further include a fifth memory cell, and the method further includes applying a fourth voltage to a fifth word line coupled to the fifth memory cell in the first phase, wherein the second voltage is greater than the fourth voltage, and wherein the fifth word line includes one or more word lines adjacent to the second word line, and the second word line is located between the first word line and the fifth word line.

20. A memory system comprising:

a memory device including:

a memory array including a memory block coupled to a peripheral circuit through a word line, wherein the memory block includes programmed memory cells and an unprogrammed memory cell, the programmed memory cells include a first memory cell and a second memory cell; and the peripheral circuit coupled to the memory array and configured to:

perform a program operation on a third memory cell in the memory block;

apply a first voltage to a first word line coupled to the first memory cell in a first phase of a channel preparation phase of the program operation; and apply a second voltage to a second word line coupled to the second memory cell, wherein the first word line is located between a third word line coupled to the third memory cell and the second word line, and the first voltage is greater than the second voltage; and a memory controller coupled to the memory device, and configured to control the memory device.

* * * * *